United States Patent
Kang et al.

(10) Patent No.: US 6,747,450 B2
(45) Date of Patent: Jun. 8, 2004

(54) WEAK-MAGNETIC FIELD SENSOR USING PRINTED CIRCUIT BOARD MANUFACTURING TECHNIQUE AND METHOD OF MANUFACTURING THE SAME

(75) Inventors: Myung-Sam Kang, Daejeon (KR); Kyoung-Won Na, Yongin-si (KR); Sang-On Choi, Suwon-si (KR); Won-Youl Choi, Suwon-si (KR); Jeong-Hwan Lee, Jinhae-si (KR); Keon-Yang Park, Seoul (KR)

(73) Assignee: Samsung-Electro-Mechanics Co., Ltd., Kyunggi-do (KR)

( * ) Notice: Subject to any disclaimer, the term of this patent is extended or adjusted under 35 U.S.C. 154(b) by 44 days.

(21) Appl. No.: 10/140,294

(22) Filed: May 8, 2002

(65) Prior Publication Data

US 2003/0169039 A1 Sep. 11, 2003

(30) Foreign Application Priority Data

Mar. 9, 2002 (KR) ........................ 2002-12765

(51) Int. Cl.[7] ............................ G01R 33/04; H01F 5/00
(52) U.S. Cl. .................. 324/253; 324/260; 336/200
(58) Field of Search ................. 324/244–260, 324/209, 234; 336/200, 232

(56) References Cited

U.S. PATENT DOCUMENTS

| | | | |
|---|---|---|---|
| 3,833,872 A | * 9/1974 | Marcus et al. | 336/83 |
| 5,936,403 A | 8/1999 | Tamura | |
| 5,986,533 A | * 11/1999 | Person et al. | 336/200 |
| 6,270,686 B1 | 8/2001 | Tamura | |
| 6,270,889 B1 | * 8/2001 | Kataoka et al. | 428/352 |
| 6,293,001 B1 | * 9/2001 | Uriu et al. | 29/608 |
| 6,388,551 B2 | * 5/2002 | Morikawa | 336/223 |
| 6,429,763 B1 | * 8/2002 | Patel et al. | 336/200 |

* cited by examiner

*Primary Examiner*—N. Le
*Assistant Examiner*—Reena Aurora
(74) *Attorney, Agent, or Firm*—Morgan, Lewis & Bockius LLP (57) ABSTRACT

A weak-magnetic field sensor using printed circuit board manufacturing technique and a method of manufacturing the same which detects earth magnetism to obtain positional information is disclosed. The sensor comprises a magnetic layer patterned in a certain shape; a first stacked board stacked on a lower surface of the magnetic layer and formed with a first driving pattern; a second stacked board stacked on an upper surface of the magnetic layer and formed with a second driving pattern, the first and second driving patterns being electrically connected to each other; a third lower stacked board stacked on a lower surface of the first stacked board and formed with a first pickup pattern; and a third upper stacked board stacked on an upper surface of the second stacked board and formed with a second pickup pattern, the third lower and upper stacked boards being electrically connected to each other.

22 Claims, 5 Drawing Sheets

WEAK-MAGNETIC FIELD SENSOR USING PRINTED CIRCUIT BOARD MANUFACTURING TECHNIQUE AND METHOD OF MANUFACTURING THE SAME

BACKGROUND OF THE INVENTION

1. Field of the Invention

The present invention relates to a weak-magnetic field sensor using printed circuit board manufacturing technique and a method of manufacturing the same, and more particularly to a weak-magnetic field sensor using printed circuit board manufacturing technique and a method of manufacturing the same which is adapted to be mounted on a mobile communication terminal to detect earth magnetism to obtain positional information.

2. Description of the Prior Art

In recent trend of offering various additional information services mobile involved in propagation of mobile phones and mobile terminals, a positional information service becomes established as an essential service, and more detailed and convenient services are required hereafter.

To achieve positional information, it is necessary to provide a sensor capable of precisely finding out a current position. As such means for providing positional information, a weak-magnetic field sensor which is intended to detect magnetism of earth to obtain positional information has been used. As a component commonly used in such a weak-magnetic field sensor, there is a flux gate sensor.

The flux gate sensor uses highly permeable magnetic strips for its core components. The flux gate sensor is comprised of a primary coil wound around one of the two magnetic cores and a secondary coil wound around the other of the magnetic cores, and is capable of recognizing a current position by detecting difference between voltage generated from the primary coil and voltage generated from the secondary coil due to variations of magnetic fields of the cores.

Such a conventional flux gate sensor is manufactured in such a way that two cylindrical core made of highly permeable magnetic material are wound with copper wires in a certain direction. More specifically, a copper wire as a driving coil (a primary coil) is wound around a magnetic core in a certain direction while maintaining constant spacing and pressure. Subsequently, a pickup coil (a secondary coil) is wound around the magnetic core to detect magnetic field generated from the magnetic core due to the driving coil. As is the case with the winding of the driving coil, a copper wire as the pickup coil is wound at a constant spacing under constant pressure.

As such, such a flux gate, which is fabricated by winding copper wires, is comprised of a driving coil and a pickup coil for detecting magnetic field generated from the driving coil. The copper coils are wound around the magnetic cores utilizing a wire coil technology well known in the art. At this point, the secondary coil must be wound to be directed in a X-axis direction and a Y-axis direction so as to precisely make an analysis of sensitivity of magnetic field. However, although a conventional flux gate sensor must maintain positional accuracy of a wound coil, it is difficult to maintain the positional accuracy. Since the positional accuracy is easily affected by temperature, light or surface material due to such configuration, accuracy of its attributes is deteriorated.

In addition, since the flux gate sensor is fabricated such that a coil is directly wound around a magnetic core, it has a disadvantage in that the coil is frequently cut. Moreover, since the sensor itself becomes large, it is not suitable to miniaturization and weight saving of electric appliances. The enlargement of the sensor requires increase of electricity consumption, so that the sensor cannot meet miniaturization and reduction of electricity consumption of electric appliances.

To overcome disadvantages of such a conventional flux gate sensor, a weak-magnetic field sensor is proposed in U.S. Pat. Nos. 5,936,403 and 6,270,686, which is manufactured in such a way that amorphous boards having circular etched portions are stacked on both upper and lower surfaces of a glass epoxy base having specific conductive patterns to form an amorphous flat board core, and glass epoxy bases etched to form X coils and Y coils are stacked on the amorphous flat board core. However, since the flux gate sensor disclosed in U.S. Pat. No. 5,936,403 requires a process of preparing the amorphous flat board core by carrying out an etching treatment into a circular shape and stacking of amorphous boards while conforming to the circular etched portion, its manufacturing process is complicated and high manufacturing cost is required due to stacking of many amorphous boards.

SUMMARY OF THE INVENTION

Accordingly, the inventor has been studied to solve the above-mentioned problems. As a result, the inventor developed a novel weak-magnetic field sensor using printed circuit board manufacturing technique and a method of manufacturing the same, which meets the needs for miniaturization and reduction of electric power consumption.

The present invention has been made keeping in mind the above problems occurring in the prior art, and an object of the present invention is to provide a weak-magnetic field sensor using printed circuit board manufacturing technique and a method of manufacturing the same which can detect weak-magnetic field with precision and maintain positional accuracy.

Another object of the present invention is to provide a weak-magnetic field sensor using printed circuit board manufacturing technique and a method of manufacturing the same which is capable of meeting the need for high density mounting required in a field of application such as mobile phones by accomplishing miniaturization, excellent magnetic efficiency and low electric power consumption by an etching technique for a printed circuit board.

In order to accomplish the above object, the present invention provides a weak-magnetic field sensor comprising: a magnetic layer which is patterned in a certain shape; a first stacked board which is stacked on a lower surface of the magnetic layer and which is formed with a first driving pattern; a second stacked board which is stacked on an upper surface of the magnetic layer and which is formed with a second driving pattern, the first and second driving patterns being electrically connected to each other; a third lower stacked board which is stacked on a lower surface of the first stacked board and which is formed with a first pickup pattern; and a third upper stacked board which is stacked on an upper surface of the second stacked board and which is formed with a second pickup pattern, the third lower and upper stacked boards being electrically connected to each other.

Furthermore, the present invention provides A method of manufacturing a weak-magnetic field sensor using printed circuit board manufacturing technique, comprising the steps of: preparing a first stacked board by stacking a first conductive layer, a first base layer and a magnetic layer in this order; preparing a second stacked board by stacking a second base layer and a second conductive layer on the first stacked board in this order; forming via-holes at the first and second conductive layers to electrically connect both the conductive layers to each other; providing driving patterns corresponding to the magnetic layer to the first and second conductive layers; preparing a pair of third stacked boards by stacking a third base layer and a third conductive layer on a lower surface of the first stacked board and by stacking a third base layer and a third conductive layer on an upper surface of the second stacked board; forming through holes at the pair of third conductive layers to electrically connect the pair of third conductive layers to each other; and providing pickup patterns to the pair of conductive layers.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

This invention will be described in further detail by way of example with reference to the accompanying drawings.

Figure 1:
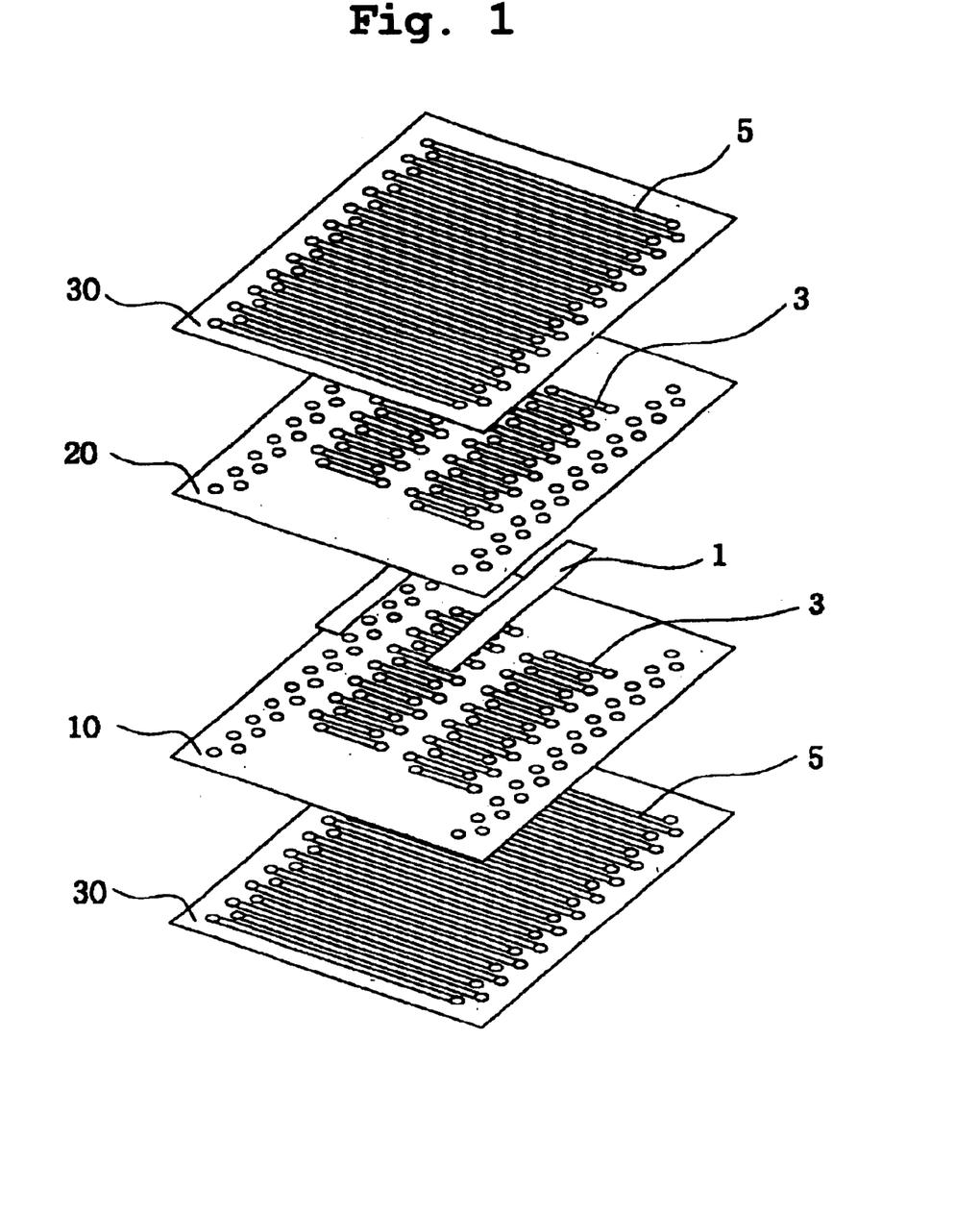
FIG. 1 is an exploded perspective view of an embodiment of a weak-magnetic field sensor using printed circuit board manufacturing technique according to the present invention.
Figure 2:
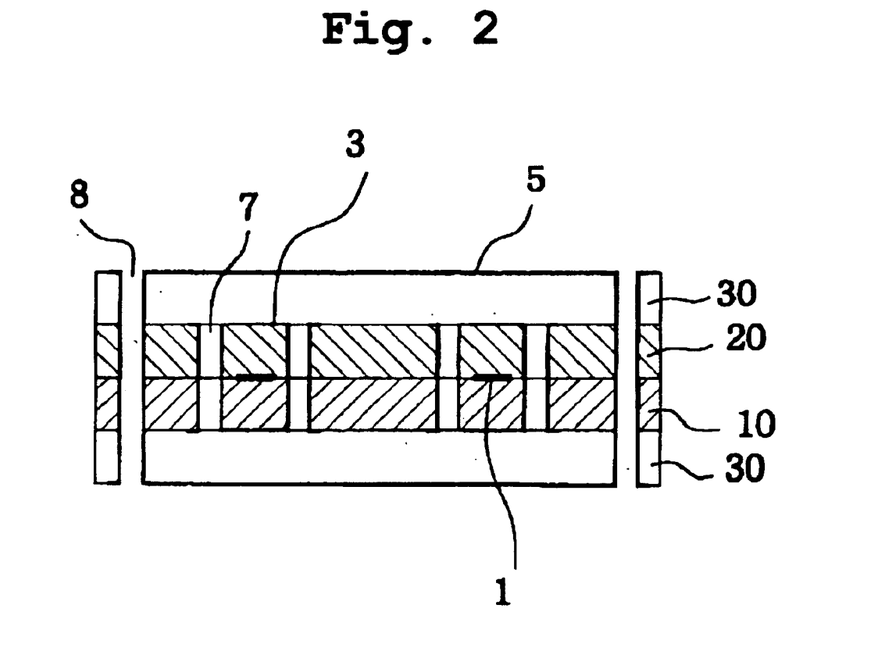
FIG. 2 is a cross-sectional view of the sensor of FIG. 1 in which the boards are stacked.

FIGS. 1 and 2 are an exploded perspective view and a cross-sectional view of an embodiment of a weak-magnetic field sensor using printed circuit board manufacturing technique according to the present invention.

As shown in the drawings, the weak-magnetic field sensor using printed circuit board manufacturing technique according to the present invention comprises magnetic bodies 1 patterned into a certain shape, a first stacking board 10 having driving patterns 3 and stacked under the magnetic bodies 1, a second stacking board 20 stacked on the magnetic bodies 1, and a pair of third stacking boards 30 having pickup patterns 5 and stacked under the first stacking board 10 and on the second stacking board 20.

More specifically, the pair of stripe-shaped patterned magnetic bodies arranged to be parallel are stacked thereunder with the first stacking board 10, and stacked thereon with the second stacking board 20. The first and second stacking boards 10 and 20 are provided with driving patterns 3 corresponding to the pair of magnetic bodies 1. As shown in FIG. 1, the driving patterns 3 are arranged to be parallel to each other and to be perpendicular to the strip-shaped magnetic bodies 1. Since the driving patterns 3 formed at both the first and second boards 10 and 20 face each other and are electrically connected to each other in a zigzag manner by via-holes 7 formed thereat, the driving patterns 3 of the first and second stacking boards 10 and 20 in contact with one magnetic body 1 serve as a pattern wire wound around the magnetic body 1.

The pair of third stacking boards 30 having pickup patterns 5 are stacked under the first stacking board 10 having the driving patters 3 and stacked on the second stacking board 20 having the driving patterns 3. As shown in FIG. 1, the pickup patterns 5 are formed to have a plurality of parallel straight lines and arranged to be perpendicular to the strip-shaped magnetid bodies 1. The pickup patterns are sized to be longer than the driving patterns 3.

To electrically connect the upper and lower pickup patterns 5, the first, second and third stacking boards 10, 20 and 30 are formed with through holes 8. The pickup patterns 5 are formed to have the same orientation as that of the driving patterns 3. The pickup patterns 5 formed at the upper stacking boards 30 is connected to the pickup patterns 5 formed at the lower stacking boards 30 through the through holes 8 in a zigzag manner to form a continuous pattern line wound the magnetic bodies 1 and the driving patterns 3.

In an operation of the weak-magnetic field sensor using printed circuit board manufacturing technique according to the present invention, when alternating current flows in the driving patterns 3, induction current flows in the pickup patterns 5, thereby generating voltage difference. By detecting the voltage difference, it is possible to find out its position or orientation.

FIGS. 3a to 3i show a process of manufacturing an embodiment of a weak-magnetic field sensor using printed circuit board manufacturing technique according to the present invention.

Figure 3A:
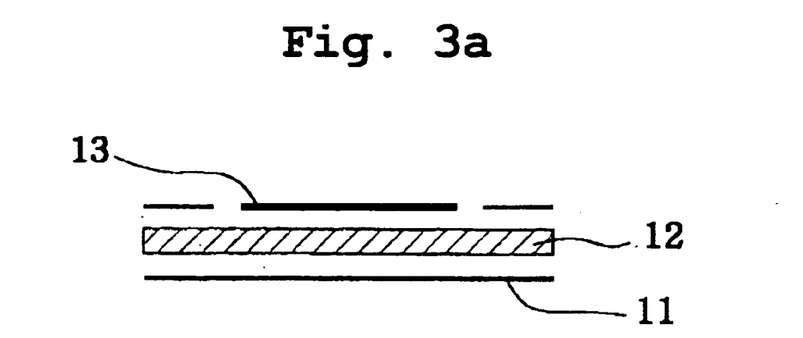
FIGS. 3a to 3i show a process of manufacturing an embodiment of a weak-magnetic field sensor using printed circuit board manufacturing technique according to the present invention.
Figure 3B:
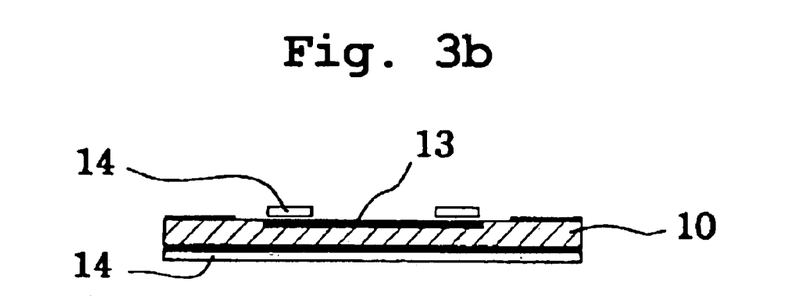

First, a first stacked board 10 is prepared. To this end, a first base layer 12 and magnetic layer 13 are placed on a first conductive layer 11 and a lay-up procedure is carried out (FIG. 3a). It is preferable that the first conductive layer 11 is made of a copper foil. The first base layer 12 is a prepreg which is partially cured, and, for example, is selected from a group consisting of FR-4, FR-4 having high glass transition temperature (Tg), bismaleimide-triazine (BT) epoxy resin and so on which are well known in the art. Material which is usually used in a printed circuit board is preferably used. Material of the magnetic layer 13 is selected from a group consisting of amorphous metal, Permalloy and Supermalloy.

According to the present invention, the first conductive layer 11, the first base layer 12 and the magnetic layer 13 are laminated in this order to form the first stacking board 10. The magnetic layer is typically formed to have the same size as that of an underlying base layer (or a prepreg), or formed to have a size determined in consideration of a manufacturing process of an actual product (for example, a magnetic strip shape). An embodiment of a preliminary lay-up using such a magnetic strip which is intended to prepare the first stacked board 10 is shown FIG. 4.

Figure 4:
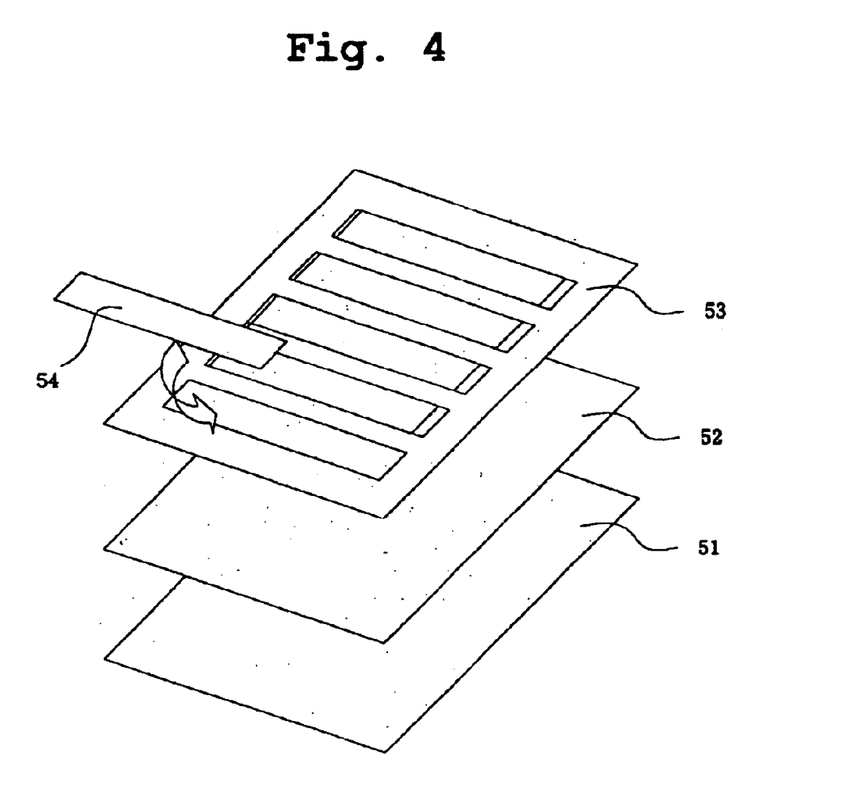
FIG. 4 shows a lay-up process of a first stacked board according to the present invention.

FIG. 4 shows an embodiment of a lay-up to be fabricated into a base layer of work size. An actual finished product is generally formed into a strip including a weak-magnetic field sensor unit. Referring to the drawing, there is shown a lay-up procedure of five magnetic ribbons 54. In this case, a magnetic ribbon 54 is used to fabricate a strip including a plurality of units. Accordingly, size of the magnetic ribbon is determined depending on size of a strip. However, where being fabricated into a strip, it is necessary to arrange the magnetic ribbons 54 on a prepreg 52 in a subsequent patterning procedure of magnetic layer such that a plurality of units can be fabricated all at once. Accordingly, in the embodiment, a copper foil 53 on which the magnetic ribbons are to be arranged is positioned to carry out a preliminary lay-up. It is possible to use two methods of fabricating the copper foil. That is, there are a method of removing a portion of desired size by pressing a magnetic plate with a metal mold, and a method of removing a portion of desired size by a rotating tool using a router process which is one of general processes of fabricating base boards. In this case, a worked object must have a size larger than that of the magnetic ribbons 54. In this connection, it is preferable to work an object to be larger by about 0.1–0.2 mm in one direction in consideration of working tolerance and a problem caused by a copper foil covered with magnetic ribbons. Considering an area of a strip occupied by actual products, since the magnetic ribbon 54 has a sufficient size, it is possible to conform the ribbon to a width of the strip. However since one or more strips may be contained in a magnetic ribbon, length of the magnetic ribbon is determined in a initial design.

After the copper foil 11, the first base layer 12 and the magnetic layer 13 are laminated in this order and the preliminary lay-up is carried out, the laminated layers 11, 12 and 13 are pressed at high temperature and under high pressure (for example, about 150–200° C. and about 30–40 kg/cm²) to form the first stacked board 10.

Figure 3C:
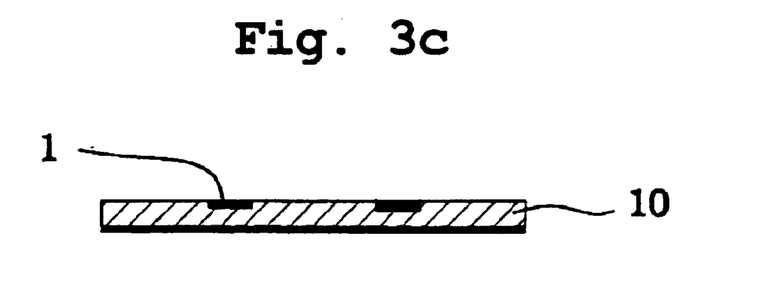

After completion of the first stacking, the first stacked board 10 exhibits a laminated board in which the magnetic layer 13 is laminated on a side of the baser layer. At this point, although preferable thicknesses of the first baser layer (prepreg) 12 and the magnetic layer 13 fall in ranges of about 0.06–0.1 mm and about 0.02–0.03 mm, the thicknesses may be varied depending on desired characteristics of finished products. Subsequently, the first stacked board 10 is formed at its upper surface with a dry film (or photoresist) 14 (FIG. 3b), and the dry film layer is subjected to exposure and developing treatments according to a magnetic pattern designed in advance. The dry film layer 14 patterned in a certain shape serves as a mask for etching the magnetic layer 13. The exposure, development and etching techniques are well known in the art. As a result, only the magnetic strips 1 patterned in a certain pattern remains on the base board, thereafter the dry film layer 14 is stripped (FIG. 3c). In particular, since the first conductive layer (copper foil) 11 is patterned (driving patterning) after second stacking procedure to be described hereinafter, the copper foil layer is protected by a dry film from the exposure treatment of the patterning process of the magnetic layer so that the copper foil is not affected by etching liquid.

Figure 5:
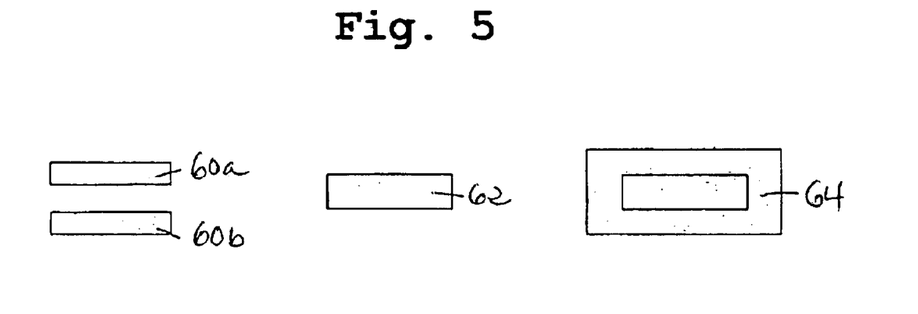
FIG. 5 shows examples of a magnetic layer contained in the first stacked board according to the present invention.

Referring to FIG. 5, there are shown examples of patterned magnetic strip usable in the present invention. That is, a pair of parallel magnetic bands 60a and 60b with a spacing, a single magnetic band 62 or a rectangular magnetic strip 64 may be used.

Figure 3D:
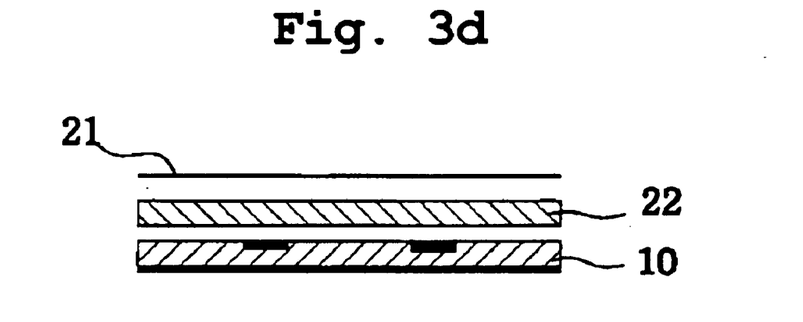
Figure 3E:
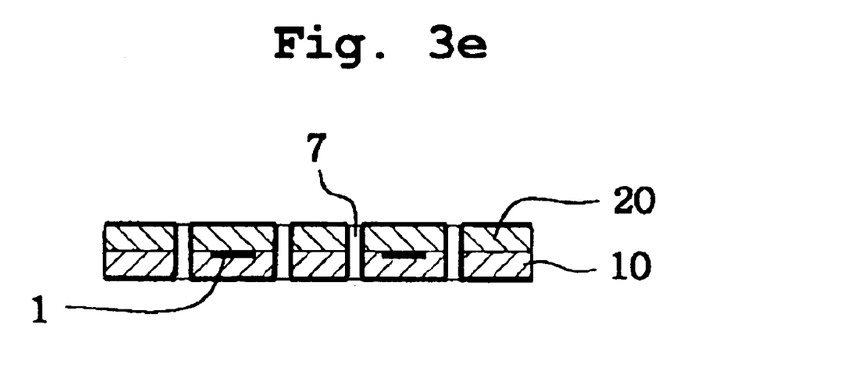
Figure 3F:
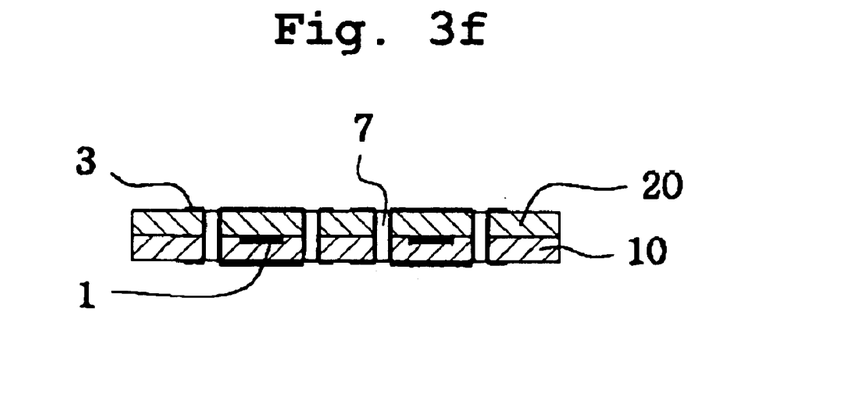

After completion of pattering procedure for the magnetic layer of the first stacked board 10, a second base layer (or prepreg) 22 and a second conductive layer (or copper foil) 21 are temporarily placed on the first stacked board 10 (preliminary lay-up), and the laminated layers 21 and 22 are pressed at high temperature and under high pressure (for example, about 150–200° C. and about 30–40 kg/cm²) to form the second stacked board 20 (FIG. 3d). Subsequently, the first and second conductive layers 11 and 21 are formed with driving patterns 3 such that the driving patterns 3 assume coils wound around the magnetic strips 1. At this point, since the driving patterns 3 formed at the first and second conductive layers 11 and 21 must be electrically connected to each other, prior to the circuit patterning procedure, the first and second conductive layers 11 and 21 are formed with inner via-holes (IVH) 7 by drills, and the inner via-holes 7 are plated at inner surfaces thereof with conductive metal, i.e., copper (FIG. 3e). At this point, to obtain integrity of electrical connection between the driving patterns 3 of the first conductive layer 11 and the driving patterns 3 of the second conductive layers 21, each of the via-holes 7 is preferably worked to have a diameter of about 0.15–0.2 mm. Thereafter, the first and second conductive layers 11 and 21 are formed with the driving patterns 3 corresponding to the patterned magnetic strips 1 by known manufacturing procedures of printed circuit board, i.e., exposure, developing and etching techniques (FIG. 3f). The driving patterns 3 are electrically connected by the via-holes 7 to serve as driving coils.

Figure 3G:
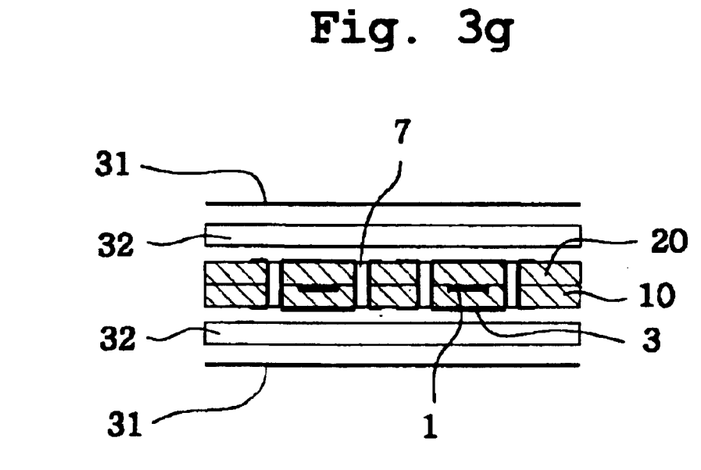
Figure 3H:
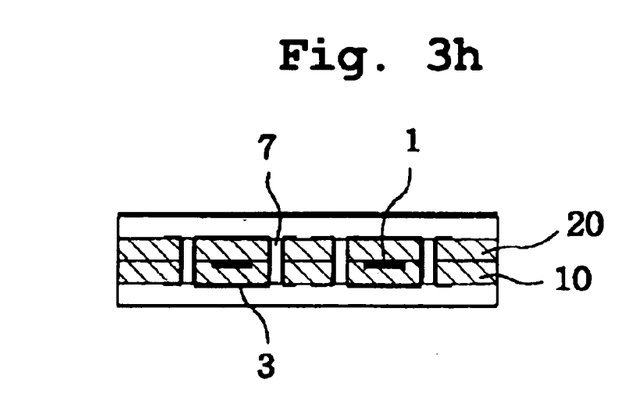

As such, after the driving patterns 3 are formed on the first and second stacked boards 10 and 20, a third upper base layer (or prepreg) 32 and a third upper conductive layer (or copper foil) 31 are placed on the second stacked board 20 in this order, and a third lower base layer (or prepreg) 32 and a third lower conductive layer (or copper foil) 31 are placed on the first stacked board 10 in this order to form a third stacked board 30 (FIG. 3g). Prior to this stacking procedure, the first and second stacked boards 10 and 20 are preferably subjected to black oxidation as pretreatment to facilitate subsequent stacking. As is the case with the above-described second stacking procedure, after the third base layers (prepregs) 32 and the third conductive layers (copper foil) 31 are subjected to preliminary lay-up, laminated layers 32 and 31 and the first and second stacked boards are pressed at high temperature and under high pressure (for example, about 150–200° C. and about 30–40 kg/cm²) (FIG. 3h).

The conductive layers 31 of the third stacked boards 30 are formed with pickup patterns 5. The pickup patterns surround the driving patterns 3, and serve as pickup coils of a finished flux gate sensor.

Figure 3I:
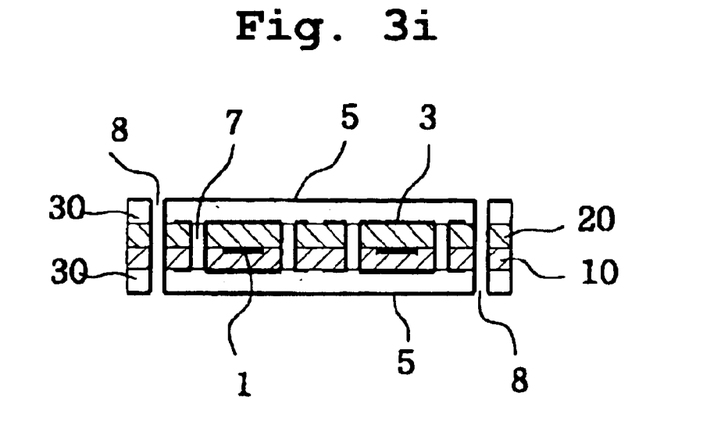

Since the upper and lower pickup patterns 5 formed on the pair of third conductive layers 31 must be electrically. connected to each other, prior to the circuit patterning, the first, second and third stacked boards 10, 20 and 30 are formed. with through holes 8 by drills and the plated-through holes are plated at inner surfaces thereof with conductive metal (i e., copper) to form plated-through holes (PTH). Since size of the through holes 8 is a important factor in determining size of products, although the smaller the through holes are, the better, it is preferable to have diameter of about 0.15–0.25 mm in terms of process capability of a printed circuit board. Thereafter, the third stacked boards are formed with the pickup patterns 5 by the known exposure, development and etching techniques (FIG. 3i). To prevent the patterned conductive layers (i.e., copper circuits) exposed to outside from being oxidized by humidity etc., solder mask is selectively applied to all areas excepting the conductive layers, and the conductive layers are formed with nickel (or nickel-phosphor) plated layers and gold plated layers in this order. Specific manners of such procedures are well known in the art of printed circuit board.

As mentioned previously, the first, second and third conductive layers 11, 21 and 31 used in the stacking procedures of the first, second and third stacked boards 10, 20 and 30 may be made of copper foils. As the copper foils, standardized copper foils of thickness 12 $\mu$m, 18 $\mu$m, 35 $\mu$m and so on may be used. However, where copper foils of thickness 35 $\mu$m are used, it is required to reduce the thickness of the copper foils to at least about 5–7 $\mu$m so as to form circuit patterns after the stacking procedure and before the drilling procedure.

Since the weak-magnetic field sensors using printed circuit board manufacturing technique according to the present invention are arranged in only one axis direction, it is possible to find out an orientation relative to only the axis. Accordingly, it is possible to find out orientations relative to two axes by arranging two printed circuit boards to be perpendicular to each other.

The weak-magnetic field sensors using printed circuit board manufacturing technique according to the present invention can be broadly used in automobiles, aircraft, game machines, toy robots as well as mobile phones and mobile terminals which are intended to detect magnetism of earth to find out its positional information.

As described above, the present invention provides a weak-magnetic field sensor using printed circuit board manufacturing technique and a method of manufacturing the same which is manufactured in such a way that circuits are formed on base boards having magnetic strips by etching etc., and driving and pickup patterns are formed thereon so as to detect weak-magnetic field.

According to the present invention, since circuits are precisely formed on base boards for detecting weak-magnetic field by etching and so on, it is possible to obtain precise attributes, and it is possible to reduce effects by variance of attributes by maintaining positional accuracy.

In addition, since the present invention can provide a weak-magnetic field sensor, which is miniaturized and consumes low electric power, the sensor can be easily adopted in small-sized electric appliances such as mobile phones.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A weak-magnetic field sensor using printed circuit board manufacturing technique comprising:
    a magnetic layer which is patterned in a certain shape;
    a first stacked board which is stacked on a lower surface of the magnetic layer and which is formed with a first driving pattern;
    a second stacked board which is stacked on an upper surface of the magnetic layer and which is formed with a second driving pattern, the first and second driving patterns being electrically connected to each other;
    a third lower stacked board which is stacked on a lower surface of the first stacked board and which is formed with a first pickup pattern; and
    a third upper stacked board which is stacked on an upper surface of the second stacked board and which is formed with a second pickup pattern, the third lower and upper stacked boards being electrically connected to each other.

2. The weak-magnetic field sensor as set forth in claim 1, in which material of the magnetic layer is selected from a group consisting of amorphous metal, Permalloy and Supermalloy.

3. A weak-magnetic field sensor using printed circuit board manufacturing technique which is configured by arranging the two weak-magnetic field sensors of claim 2 to be perpendicular to each other.

4. The weak-magnetic field sensor as set forth in claim 1, in which the patterned magnetic layer is selected from a group consisting of a pair of parallel magnetic bands with a spacing, a single magnetic band and a rectangular magnetic strip.

5. A weak-magnetic field sensor using printed circuit board manufacturing technique which is configured by arranging the two weak-magnetic field sensors of claim 4 to be perpendicular to each other.

6. The weak-magnetic field sensor as set forth in claim 1, in which the patterned magnetic layer is formed into a band shape, and the driving patterns and the pickup patterns are oriented to be perpendicular to the magnetic layer.

7. A weak-magnetic field sensor using printed circuit board manufacturing technique which is configured by arranging the two weak-magnetic field sensors of claim 6 to be perpendicular to each other.

8. The weak-magnetic field sensor as set forth in claim 1, in which the driving patterns and the pickup patterns are comprised of a plurality of parallel straight patterned lines, and the pickup patterns are longer than the driving patterns.

9. A weak-magnetic field sensor using printed circuit board manufacturing technique which is configured by arranging the two weak-magnetic field sensors of claim 8 to be perpendicular to each other.

10. The weak-magnetic field sensor as set forth in claim 1, in which the first stacked board and the second stacked board are formed with via-holes such that the driving pattern of the first stacked board and the driving pattern of the second stacked board are electrically connected to each other, and the third lower and upper stacked boards are formed with through holes such that the pickup pattern of the third lower stacked board and the pickup pattern of the third upper stacked board are electrically connected to each other.

11. The weak-magnetic field sensor as set forth in claim 10, in which the patterned lines of the driving pattern of the first stacked board and the patterned lines of the driving pattern of the second stacked board are electrically connected to each other in a zigzag manner by the via-holes to form a coil comprised of a single line surrounding the magnetic layer, and the patterned lines of the lower pickup pattern and the patterned lines of the upper pickup pattern are electrically connected to each other in a zigzag manner by the through holes to form a coil comprised of a single line surrounding the driving patterns.

12. A weak-magnetic field sensor using printed circuit board manufacturing technique which is configured by arranging the two weak-magnetic field sensors of claim 11 to be perpendicular to each other.

13. A weak-magnetic field sensor using printed circuit board manufacturing technique which is configured by arranging the two weak-magnetic field sensors of claim 10 to be perpendicular to each other.

14. A weak-magnetic field sensor using printed circuit board manufacturing technique which is configured by arranging the two weak-magnetic field sensors of claim 1 to be perpendicular to each other.

15. A method of manufacturing a weak-magnetic field sensor using printed circuit board manufacturing technique, comprising the steps of:
    preparing a first stacked board by stacking a first conductive layer, a first base layer and a magnetic layer in this order;
    preparing a second stacked board by stacking a second base layer and a second conductive layer on the first stacked board in this order;
    forming via-holes at the first and second conductive layers to electrically connect both the conductive layers to each other;
    providing driving patterns corresponding to the magnetic layer to the first and second conductive layers;
    preparing a pair of third stacked boards by stacking a third base layer and a third conductive layer on a lower surface of the first stacked board and by stacking a third base layer and a third conductive layer on an upper surface of the second stacked board;
    forming through holes at the pair of third conductive layers to electrically connect the pair of third conductive layers to each other; and
    providing pickup patterns to the pair of conductive layers.

16. The method as set forth in claim 15, in which the magnetic layer is selected from a group consisting of a pair of parallel magnetic bands with a spacing, a single magnetic band and a rectangular magnetic strip.

17. The method as set forth in claim 15, after the step of preparing the first stacked board, further comprising a step of patterning the magnetic layer in a certain shape.

18. The method as set forth in claim 15, in which the magnetic layer has a ribbon shape, and prior to the step of preparing the first stacked board, further comprising a step of carrying out a preliminary lay-up to allow the ribbon-shaped magnetic layer to be stacked at a predetermined position of the stacked board.

19. The method as set forth in claim 15, in which the first, second and third conductive layers are comprised of copper foils.

20. The method as set forth in claim 15, in which the first, second and third base layers are comprised of prepregs.

21. The method as set forth in claim 20, in which the prepreg is selected from a group consisting of FR-4, FR-4 having high glass transition temperature (Tg) and bismaleimide-triazine (BT) epoxy resin.

22. The method as set forth in claim 15, in which the step of providing the driving patterns comprises electrically connecting the patterned lines of the driving pattern of the first stacked board and the patterned lines of the driving pattern of the second stacked board to each other in a zigzag manner by the via-holes to form a coil comprised of a single line surrounding the magnetic layer, and the step of providing the pickup patterns comprises electrically connecting the patterned lines of the pickup patterns of the pair of third stacked boards to each other in a zigzag manner by the through holes to form a coil comprised of a single line surrounding the driving patterns.

* * * * *